(12) United States Patent
Tan et al.

(10) Patent No.: US 10,390,452 B2
(45) Date of Patent: Aug. 20, 2019

(54) CHIP CARD SECURING ASSEMBLY AND ELECTRONIC DEVICE APPLYING THE SAME

(71) Applicant: Chiun Mai Communication Systems, Inc., New Taipei (TW)

(72) Inventors: Jie-Yau Tan, New Taipei (TW); Fu-Hsin Sung, New Taipei (TW); Chia-Ju Lin, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 0 days.

(21) Appl. No.: 15/468,124

(22) Filed: Mar. 24, 2017

(65) Prior Publication Data
US 2017/0280579 A1    Sep. 28, 2017

(30) Foreign Application Priority Data

Mar. 25, 2016 (CN) .......................... 2016 1 0174921

(51) Int. Cl.
| H04M 1/02  | (2006.01) |
| H05K 5/02  | (2006.01) |
| H05K 7/14  | (2006.01) |
| G06K 13/08 | (2006.01) |
| H01R 24/62 | (2011.01) |
| H01R 107/00| (2006.01) |

(52) U.S. Cl.
CPC ......... *H05K 7/1461* (2013.01); *G06K 13/085* (2013.01); *G06K 13/0831* (2013.01); *H01R 24/62* (2013.01); *H04M 1/0274* (2013.01); *H05K 5/0221* (2013.01); *H01R 2107/00* (2013.01); *H04M 2250/14* (2013.01)

(58) Field of Classification Search
CPC . H05K 7/1461; H05K 5/0221; H04M 1/0202; G06K 13/08; H01R 24/62; H01R 2107/00
See application file for complete search history.

(56) References Cited

U.S. PATENT DOCUMENTS

| 5,319,519 A * | 6/1994 | Sheppard | H05K 5/0295 |
| | | | 312/319.1 |
| 5,691,859 A * | 11/1997 | Ulrich | G11B 15/6835 |
| | | | 360/92.1 |
| 5,757,583 A * | 5/1998 | Ogawa | G11B 17/022 |
| | | | 360/99.06 |
| 5,793,614 A * | 8/1998 | Tollbom | H05K 7/1409 |
| | | | 361/725 |

(Continued)

FOREIGN PATENT DOCUMENTS

| CN | 202111267 U | 1/2012 |
| CN | 104505622 A | 4/2015 |

*Primary Examiner* — David M Sinclair
*Assistant Examiner* — Theron S Milliser
(74) *Attorney, Agent, or Firm* — ScienBiziP, P.C.

(57) ABSTRACT

A chip card securing assembly detachably received in a body of an electronic device, the chip card securing assembly includes a tray and a connector. The tray includes a receiving portion and a holding portion. The receiving portion includes a first end and a second end, the second end defines a receive slot. The holding portion extends from the first end and configured to hold a chip card. The connector is received in the receiving portion and exposed from the receive slot. An electronic device applying the chip card securing assembly is also provided.

19 Claims, 5 Drawing Sheets

(56) References Cited

U.S. PATENT DOCUMENTS

| | | | | |
|---|---|---|---|---|
| 5,928,016 A * | 7/1999 | Anderson | ............ | H05K 7/1411 361/801 |
| 6,252,514 B1 * | 6/2001 | Nolan | ...................... | G06F 1/183 340/686.4 |
| 6,430,147 B1 * | 8/2002 | Goto | ...................... | G11B 23/00 720/720 |
| 6,685,489 B1 * | 2/2004 | Rubenstein | .......... | H05K 7/1409 439/157 |
| 6,991,480 B2 * | 1/2006 | Katayanagi | .......... | G06K 7/0043 439/159 |
| 7,184,274 B2 * | 2/2007 | Wu | ........................ | G06F 21/72 235/492 |
| 8,553,419 B2 * | 10/2013 | Luo | ..................... | G06K 13/0831 312/120 |
| 8,634,208 B2 * | 1/2014 | Duan | ................... | G06K 13/085 361/679.38 |
| 8,651,884 B1 * | 2/2014 | Rivera | ................ | H01R 13/635 439/159 |
| 8,913,396 B2 * | 12/2014 | Chao | ..................... | G06F 1/1656 361/679.32 |
| 8,978,495 B2 * | 3/2015 | Hsu | ........................ | F16H 21/04 379/433.12 |
| 9,311,571 B2 * | 4/2016 | Lei | ..................... | G06K 13/0831 |
| 9,648,744 B2 * | 5/2017 | Wittenberg | .............. | H05K 1/18 |
| 9,685,735 B1 * | 6/2017 | Chen | ...................... | H01R 24/62 |
| 9,787,342 B2 * | 10/2017 | Kole | ...................... | H04B 1/3816 |
| 2004/0232233 A1 * | 11/2004 | Boldt | ................... | G06K 7/0021 235/441 |
| 2005/0111178 A1 * | 5/2005 | Bradley | .................. | G06F 1/184 361/679.38 |
| 2007/0084922 A1 * | 4/2007 | Klostermeier | ........ | G06K 13/063 235/441 |
| 2009/0267677 A1 * | 10/2009 | Myers | .................... | G06K 13/08 327/356 |
| 2010/0216341 A1 * | 8/2010 | Bryant-Rich | ........ | G06K 7/0021 439/607.22 |
| 2010/0217910 A1 * | 8/2010 | Bryant-Rich | ......... | G06F 13/385 710/301 |
| 2012/0195013 A1 * | 8/2012 | Trzaskos | ............ | G06K 13/0831 361/754 |
| 2012/0276780 A1 | 11/2012 | Hu et al. | | |
| 2014/0002971 A1 * | 1/2014 | Chung | ................ | H05K 5/0286 361/679.01 |
| 2014/0029211 A1 * | 1/2014 | Gao | ...................... | H05K 5/0091 361/747 |
| 2014/0218877 A1 * | 8/2014 | Wei | ..................... | H04B 1/3816 361/752 |

* cited by examiner

CHIP CARD SECURING ASSEMBLY AND ELECTRONIC DEVICE APPLYING THE SAME

FIELD

The subject matter herein generally relates to a chip card securing assembly and an electronic device applying the chip card securing assembly.

BACKGROUND

Electronic devices, such as mobile phones, normally include an opening for receiving chip cards, SIM cards, or storage cards for instance. In addition, the electronic devices include another opening for exposing a connector, USB connector for instance. However, the electronic devices define several openings may affect an uniform appearance.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure. Moreover, in the drawings, like reference numerals designate corresponding parts throughout several views.

DETAILED DESCRIPTION

Figure 1:
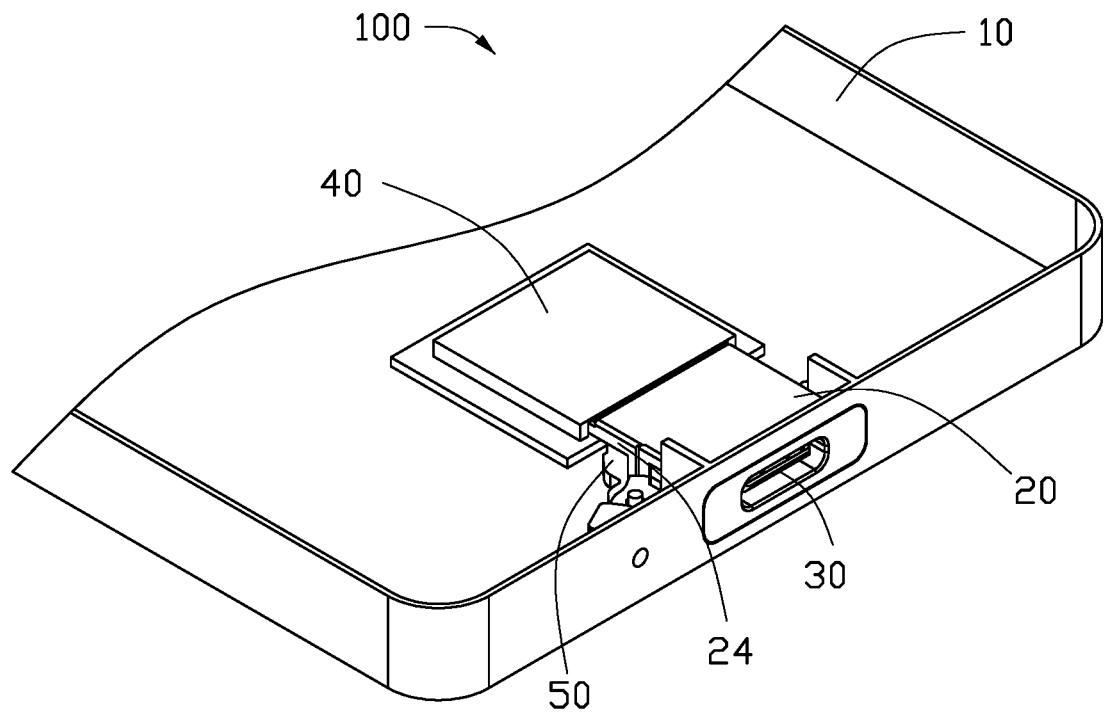
FIG. 1 is an isometric view of an exemplary embodiment of a chip card securing assembly.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

FIG. 1 illustrates an isometric view an exemplary embodiment of an electronic device 100, which can be a mobile phone, a personal digital assistant, and a tablet computer. The electronic device 100 includes a body 10, a tray 20, a connector 30, a circuit board 40 and a pushing member 50.

Figure 2:
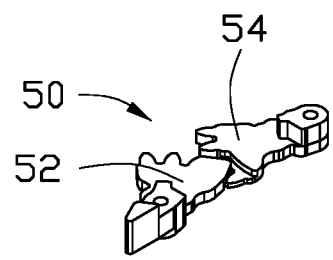
FIG. 2 is an exploded isometric view of the electronic device of FIG. 1.
Figure 2:
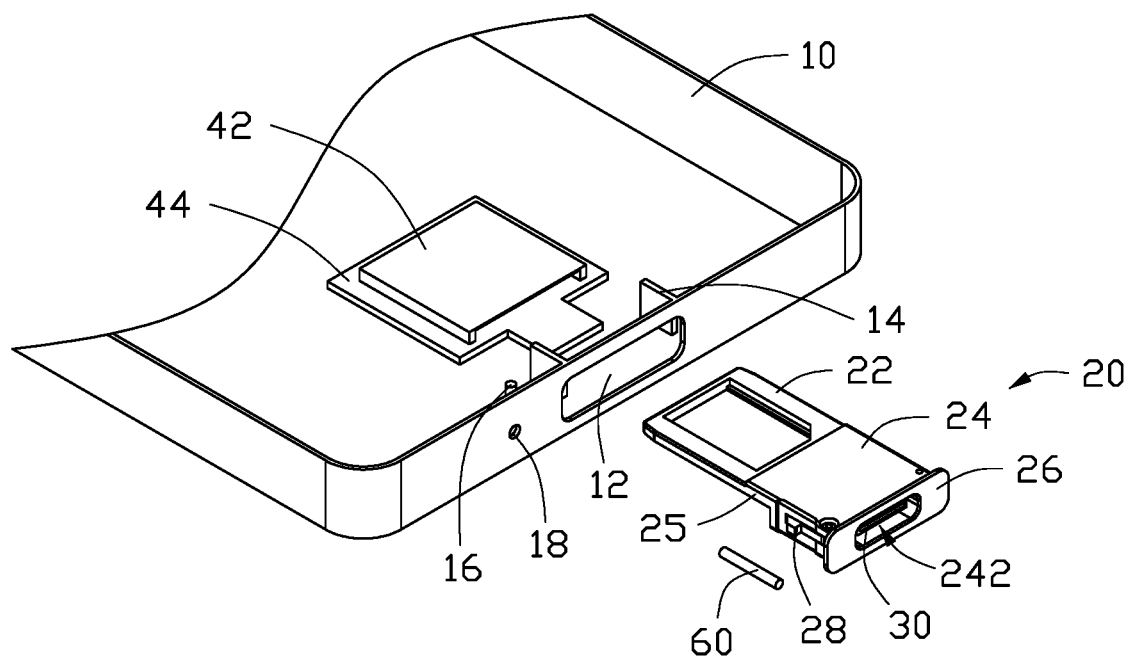

Referring to FIG. 2, the body 10 is substantially rectangular and defines an opening 12 on one sidewall. The opening 12 in air communication with an internal space and an external space of the body 10 from an end of the body 10. The body 10 further includes a rib 14 and a connecting piece 16. In at least one embodiment, the body 10 includes two ribs 14 perpendicularly extended inwardly along two opposite sides of the opening 12. The body 10 includes two connecting pieces 16 respectively arranged at two opposite sides of the opening 12. The connecting pieces 16 are substantially column-shaped. The body 10 defines a hole 18 adjacent to the opening 12. In at least one embodiment, a diameter of the hole 18 is limited for passing through a needle piece 60 from the external space to the internal space of the body 10.

Figure 3:
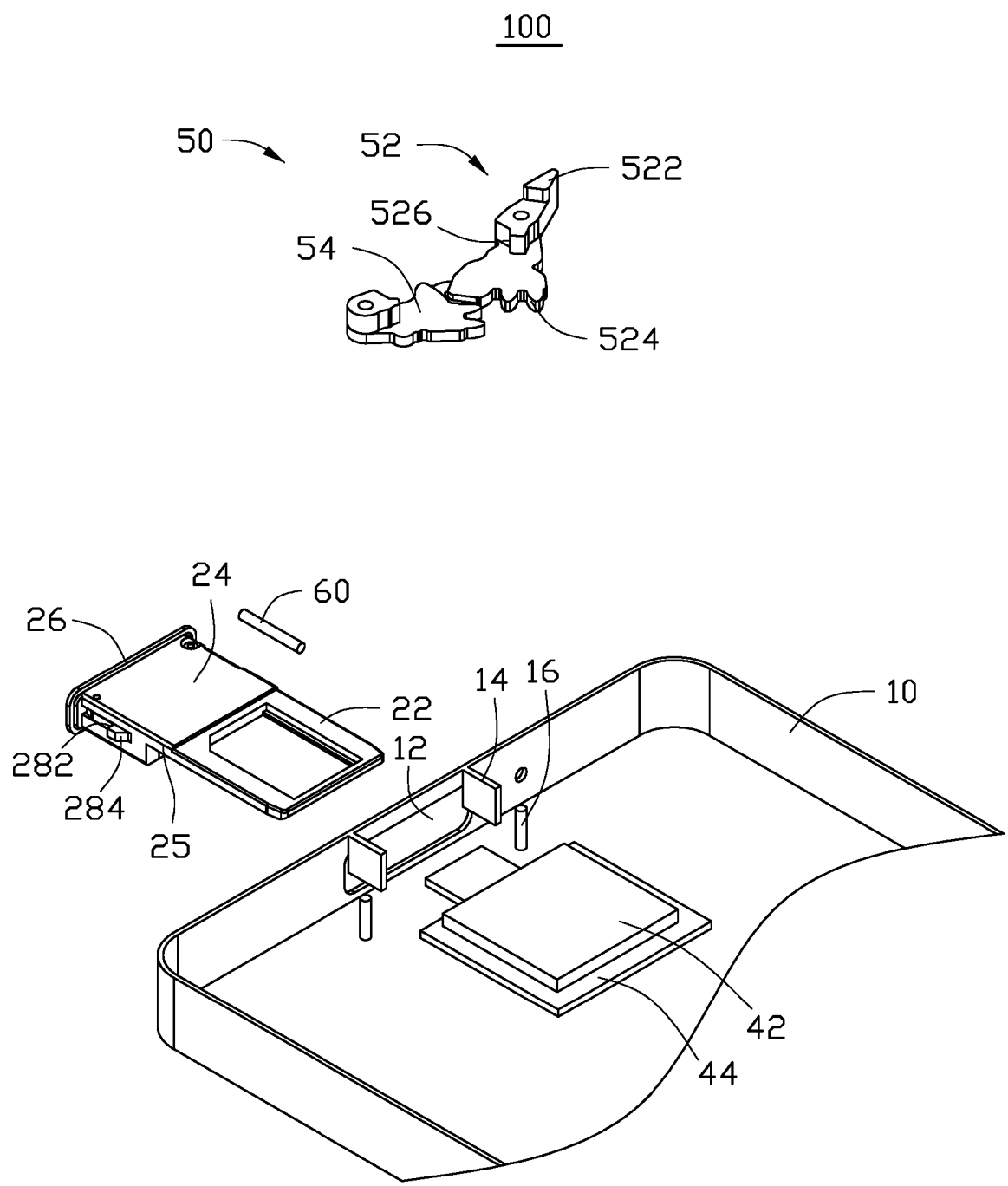
FIG. 3 is another exploded isometric view of the electronic device of FIG. 1.

Referring to FIGS. 2-5, the tray 20 is detachably received in the opening 12. The tray 20 includes a holding portion 22, a receiving portion 24, a latch portion 28 and a ridge portion 29. The receiving portion 24 includes a first end 25 and a second end 26. The holding portion 22 extends from the first end 25 and is substantially a rectangular frame, which is for holding a chip card, such as a SIM (Subscriber Identification Module) card and a storage card. In at least one embodiment, the holding portion 22 has a hollow middle portion for exposing a lower surface of the chip card from the holding portion 22 and further electronically connects to other electronic elements. The receiving portion 24 defines a receive slot 242 for receiving the connector 30. In at least one embodiment, the tray 20 includes two latch portions 28 respectively arranged on two opposite sides of the receiving portion 24. The latch portions 28 latch to the ribs 14, respectively, to couple the tray 20 to the body 10. The latch portion 28 includes a latch surface 282 and a slide surface 284 inclined to the latch surface 282 as shown in FIG. 3. The latch portion 28 are resilient, when the slide surface 284 receives external forces, the latch portion 28 compresses towards the receiving portion 24. When the tray 20 is received in the opening 12, the latch surface 282 is pressed against the rib 14. The thickness of the receiving portion 24 is greater than the thickness of the holding portion 22. The holding portion 22 is extended from an upper portion of a side of the receiving portion 24. A space below the holding portion 22 corresponds to a lower portion of the side of the receiving portion 24 is exposed. The thickness of the second end 26 is greater than the thickness of the receiving portion 24. When the tray 20 is received in the opening 12, the second end 26 closes the opening 12. The second end 26 exposes the receive slot 242. The connector 30 is received in the receive slot 242 and exposed from the slot 242. The ridge portion 29 is formed on a bottom surface of the receiving portion 24 and extends from the second end 26 towards the first end 25.

Referring to FIGS. 1 and 2, the circuit board 40 includes a first connecting board 42 and a second connecting board 44, the first connecting board 42 is overlapped on the second connecting board 44. When the tray 20 is received in the body 10, the first connecting board 42 connects to the holding portion 22 and electrically connects to the chip card received in the holding portion 22, thus, to provide electrical functions of the chip card. The second connecting board 44 electrically connects to the connector 30 to provide electrical functions of the connector 30. In at least one embodiment, the connector 30 is a USB connector, which may connect to external electronic apparatus through a USB cable, thus, to exchange data and power with external electronic apparatus.

Figure 4:
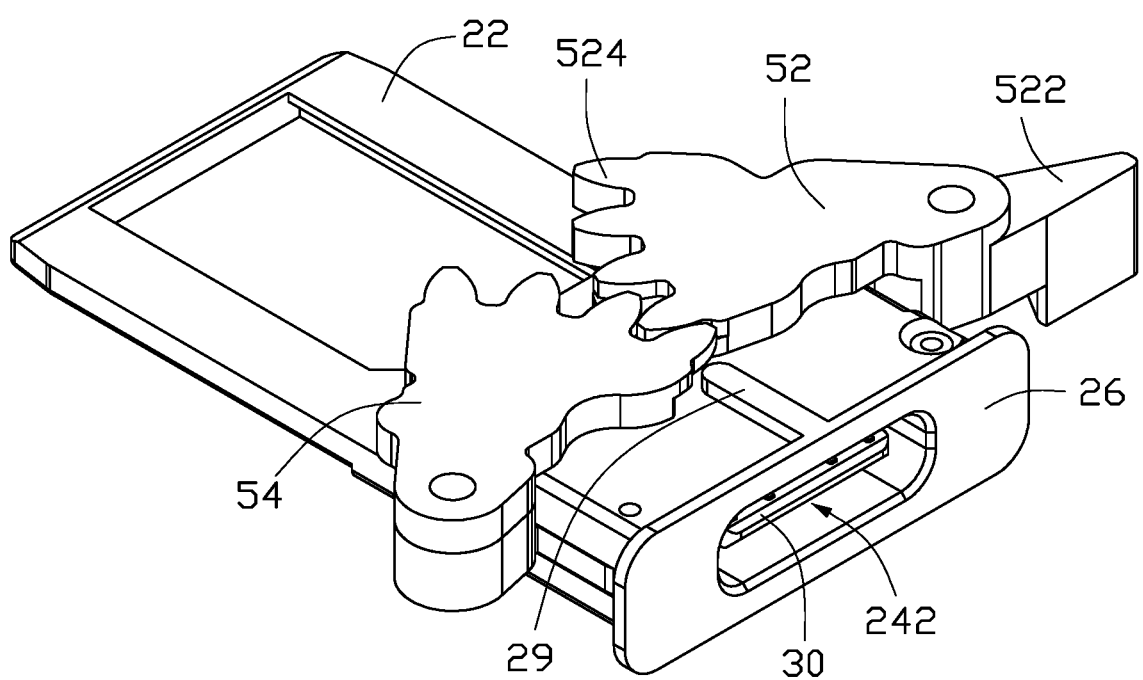
FIG. 4 is a partial exploded isometric view of the electronic device of FIG. 2.
Figure 5:
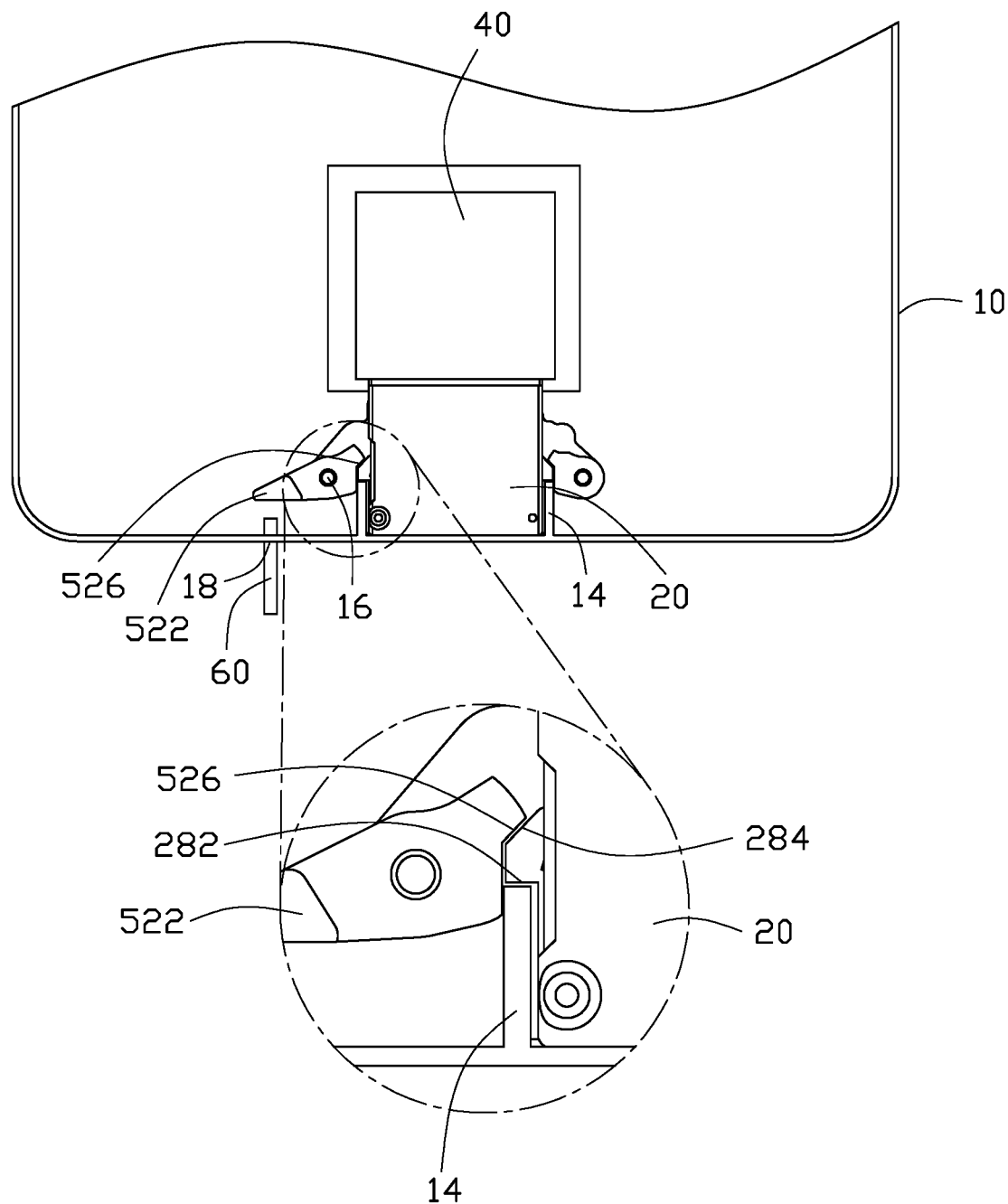
FIG. 5 is a planar view of the electronic device of FIG. 1.

Referring to FIGS. 3-5, the pushing member 50 includes a first pushing piece 52 and a second pushing piece 54. The first pushing piece 52 and the second pushing piece 54 are coupled to the two connecting pieces 16, and may rotate relative to the connecting pieces 16. The first pushing piece 52 includes a pushing portion 522, a gear portion 524, and a pressing surface 526. A structure of the second pushing piece 54 is substantially the same as that of the first pushing piece 52. The second pushing piece 54 includes a gear portion and a pressing surface same as that of the first pushing piece 52. However, a pushing portion can be omitted for the second pushing piece 54. The pushing portion 522 is aligned to the hole 18 as shown in FIG. 5. The second pushing piece 54 engages to the first pushing piece 52 through the gear portion 524. The pressing surface 526 corresponds in shape to the slide surface 284 of the latch portion 28.

Referring to FIGS. 2-5, when the holding portion 22 holds a chip card and is inserted into the opening 12, the latch portion 28 slide along the rib 14 until the slide surface 284 passes the rib 14. Thus, the latch surface 282 is pressed against the rib 14 as shown in FIG. 5. Referring to FIGS. 1 and 4, the pushing member 50 is positioned below the receiving portion 24 and interacts with an end of the ridge portion 29, a side of the gear portion 524 of the second pushing piece 54 is spaced from the ridge portion 29 with a predetermined distance. Referring to FIG. 5, the slide surface 284 corresponds to the pressing surface 526, the second end 26 closes the opening 12, and the connector 30 is exposed from the second end 26. The holding portion 22 reaches the first connecting board 42, thus the first connecting board 42 electrically connects to the chip card held by the holding portion 22, and the second connecting board 44 electrically connects to the connector 30. Therefore, when the tray 20 with the chip card is received in the body 10, the chip card and the connector 30 both are electrically connected to the circuit board 40 to achieve electrical functions.

When the tray 20 exits from the body 10, the needle piece 60 passes through the hole 18 and pushes the pushing portion 522, thus the first pushing piece 52 rotates relative to the connecting piece 16. The pressing surface 526 is pressed against the slide surface 284 and slides along the slide surface 284, the latch portion 28 receives pressure from the pressing surface 526 and compresses towards the receiving portion 24 until the pressing surface 526 passes the slide surface 284, thus to push the latch surface 282 away from the rib 14, thereby unlocking the latch portion 28. Meanwhile, the second pushing piece 54 rotates with the first pushing piece 52 through the gear portions 524, thus a side of the gear portion 524 of the second pushing piece 54 is pressed against the ridge portion 29. The pushing portion 522 is continuously pushed, the first pushing piece 52 continues to drive the second pushing piece 54 and the ridge portion 29 is pushed, until the tray 20 exits from the body 10. Therefore, user may take out the tray 20 and then take out or exchange the chip card.

In other embodiments, a quantity of the pushing member 50 can be one, a side of the gear portion 524 of the pushing member 50 is pressed against the ridge portion 29 for pushing the tray 20. When the quantity of the pushing member 50 is one, the quantity of the connecting piece 16 can be one and the connecting piece 16 can be arranged on one side of the opening 12.

The body 10 defines only one opening 12 for receiving the tray 20, the tray 20 holds the chip card and the connector 30, the connector 30 is exposed from the receive slot 242. The body 10 defines only one opening 12 to receive the chip card and the connector 30, which maintains a unified appearance.

It is believed that the embodiments and their advantages will be understood from foregoing description, and it will be apparent that various changes may be made thereto without departing from the scope of the disclosure or sacrificing all advantages, the examples hereinbefore described merely being illustrative embodiments of the disclosure.

What is claimed is:

1. A chip card securing assembly detachably received in a body of an electronic device, the chip card securing assembly comprising:
a tray, the tray comprising
a receiving portion comprising a first end and a second end, the second end defining a receive slot;
a holding portion extended from an upper portion of the first end and configured to hold a chip card;
a connector received in the receiving portion and exposed from the receive slot;
a pushing member comprising a first pushing piece and a second pushing piece; and
a ridge portion formed on a bottom surface of the receiving portion and extending from the second end towards the first end, the pushing member positioned below the receiving portion and interacting with an end of the ridge;
wherein the first pushing piece comprises a pushing portion and a gear portion, the second pushing piece comprises a gear portion structurally same as the gear portion of the first pushing piece, but lacking the pushing portion of the first pushing piece, the second pushing piece engages to the first pushing piece through the gear portion, the pushing portion of the first pushing piece is configured for receiving external force, a side of the gear portion of the second pushing piece is configured for pressing against the end of the ridge portion for pushing the tray.

2. The chip card securing assembly as claimed in claim 1, wherein the holding portion has a hollow middle portion for exposing a surface of the chip card from the holding portion.

3. The chip card securing assembly as claimed in claim 1, wherein the receiving portion defines the receive slot for receiving the connector, the connector is received in the receive slot and exposed from the receive slot.

4. The chip card securing assembly as claimed in claim 1, wherein the tray further comprises at least one latch portion arranged on at least one side of the receiving portion and configured to be detachably pressed against the body.

5. The chip card securing assembly as claimed in claim 4, wherein the tray comprises two latch portions respectively arranged on two opposite sides of the receiving portion.

6. The chip card securing assembly as claimed in claim 4, wherein the latch portion includes a latch surface and a slide surface inclined to the latch surface, the latch portion has resilience, when the slide surface receives external forces, the latch portion compresses towards the receiving portion.

7. The chip card securing assembly as claimed in claim 6, wherein a thickness of the receiving portion is greater than a thickness of the holding portion, the holding portion is connected to an upper portion of a side of the receiving portion, and exposing a lower portion of the side of the receiving portion.

8. An electronic device comprising:
a body defining an opening;
a tray, the tray comprising a receiving portion comprising a first end and a second end, the second end defining an receive slot;

a holding portion extended from an upper portion of the first end and configured to hold a chip card;

a connector received in the receiving portion and exposed from the receive slot;

a pushing member comprising a first pushing piece and a second pushing piece; and a ridge portion formed on a bottom surface of the receiving portion and extending from the second end towards the first end, the pushing member positioned below the receiving portion and interacting with an end of the ridge;

wherein the first pushing piece comprises a pushing portion and a gear portion, the second pushing piece comprises a gear portion structurally same as the gear portion of the first pushing piece, but lacking the pushing portion of the first pushing piece, the second pushing piece engages to the first pushing piece through the gear portion, the pushing portion of the first pushing piece is configured for receiving external force, a side of the gear portion of the second pushing piece is configured for pressing against an end of the ridge portion for pushing the tray.

9. The electronic device as claimed in claim 8, wherein the holding portion has a hollow middle portion for exposing a surface of the chip card from the holding portion.

10. The electronic device as claimed in claim 8, wherein the receiving portion defines the receive slot for receiving the connector, the connector is received in the receive slot and exposed from the receive slot.

11. The electronic device as claimed in claim 8, wherein the tray further comprises at least one latch portion arranged on at least one side of the receiving portion and configured to be detachably pressed against the body.

12. The electronic device as claimed in claim 11, wherein the tray comprises two latch portions respectively arranged on two opposite sides of the receiving portion.

13. The electronic device as claimed in claim 11, wherein the body comprises at least one rib and at least one connecting piece, the at least one rib perpendicularly extends inwardly along at least one side of the opening, the at least one connecting piece is arranged at least one side of the opening.

14. The electronic device as claimed in claim 13, wherein the body comprises two ribs and two connecting pieces, the ribs perpendicularly extend inwardly along two opposite sides of the opening, the connecting pieces are respectively arranged at two opposite sides of the opening.

15. The electronic device as claimed in claim 14, wherein the latch portion includes a latch surface and a slide surface inclined to the latch surface, the latch surface correspond to one of the ribs, the latch portion has resilience, when the slide surface receives external forces, the latch portion compresses towards the receiving portion.

16. The electronic device as claimed in claim 15, wherein the first pushing piece and the second pushing piece are coupled to the two connecting pieces, respectively, and rotate relative to the connecting pieces.

17. The electronic device as claimed in claim 16, wherein the pressing surface corresponds in shape to the slide surface of the latch portion.

18. The electronic device as claimed in claim 17, further comprising a first connecting board and a second connecting board, wherein a thickness of the receiving portion is greater than a thickness of the holding portion, the holding portion is connected to an upper portion of a side of the receiving portion, and exposing a lower portion of the side of the receiving portion; the first connecting board is overlapped on the second connecting board, the first connecting board electrically connects to the chip card held by the holding portion, the second connecting board electrically connects to the connector.

19. The electronic device as claimed in claim 18, wherein the pushing member is detachably pressed against the ridge portion for pushing the tray.

* * * * *